United States Patent [19]

Naddor et al.

[11] Patent Number: 4,922,456
[45] Date of Patent: May 1, 1990

[54] METHOD OF REDUCING WEAROUT IN A NON-VOLATILE MEMORY WITH DOUBLE BUFFER

[75] Inventors: David J. Naddor, Doraville; Randolph J. Schaubs, Stone Mountain, both of Ga.

[73] Assignee: Scientific-Atlanta, Inc., Atlanta, Ga.

[21] Appl. No.: 187,979

[22] Filed: Apr. 29, 1988

[51] Int. Cl.$^5$ .......................... G11C 7/00; G11C 11/40
[52] U.S. Cl. ...................................... 365/185; 365/228; 365/200; 365/189.05; 371/66
[58] Field of Search ............... 365/185, 200, 226, 228, 365/189.05; 371/66

[56] References Cited

U.S. PATENT DOCUMENTS

| | | | |
|---|---|---|---|
| 4,393,500 | 7/1983 | Imazeki et al. | 364/900 X |
| 4,442,501 | 4/1984 | Eckert, Jr. et al. | 364/900 X |
| 4,447,887 | 5/1984 | Imazeki et al. | 371/13 X |
| 4,493,083 | 1/1985 | Kinoshita | 365/228 |
| 4,564,922 | 1/1986 | Muller | 365/900 X |
| 4,612,632 | 9/1986 | Olson | 365/226 X |
| 4,663,770 | 5/1987 | Murray et al. | 377/28 X |

FOREIGN PATENT DOCUMENTS

| | | | |
|---|---|---|---|
| 53-63935 | 6/1978 | Japan | 365/240 |
| 56-137594 | 10/1981 | Japan | . |
| 57-125296 | 7/1982 | Japan | . |

*Primary Examiner*—Stuart N. Hecker
*Assistant Examiner*—Alfonso Garcia
*Attorney, Agent, or Firm*—Banner, Birch, McKie & Beckett

[57] ABSTRACT

A method of preventing a power failure from corrupting data being written to a non-volatile memory. Before a write operation is performed, information is written to a double buffer to reconstruct the steps that will be performed during the write operation. A flag is set indicating that the information in the double buffer is accurate. The write operation is then performed and the flag is cleared. The double buffer is dynamically moved throughout the non-volatile memory to distribute the wearout of the non-volatile memory as evenly as possible.

20 Claims, 4 Drawing Sheets

| MEMORY LOCATION | DATA |
|---|---|
| 1 | 10 |
| 2 | 20 |
| 3 | 30 |
| 4 | 40 |
| 5 | 50 |
| 6 | 0 |
| 7 | 0 |
| 8 | 0 |
| 9 | 6 |

DOUBLE BUFFER: locations 6–8

FIG. 4b

| MEMORY LOCATION | DATA |
|---|---|
| 1 | 10 |
| 2 | 20 |
| 3 | 30 |
| 4 | 40 |
| 5 | 50 |
| 6 | 0 |
| 7 | 0 |
| 8 | 50 |
| 9 | 6 |

DOUBLE BUFFER: locations 6–8

FIG. 4c

| MEMORY LOCATION | DATA |
|---|---|
| 1 | 10 |
| 2 | 20 |
| 3 | 30 |
| 4 | 40 |
| 5 | 50 |
| 6 | 0 |
| 7 | 0 |
| 8 | 50 |
| 9 | 5 |

DOUBLE BUFFER: locations 5–7

FIG. 5a

| MEMORY LOCATION | DATA |
|---|---|
| 1 | 10 |
| 2 | 20 |
| 3 | 30 |
| 4 | 40 |
| 5 | 0 |
| 6 | 0 |
| 7 | 0 |
| 8 | 50 |
| 9 | 5 |

DOUBLE BUFFER: locations 5–7

FIG. 5b

| MEMORY LOCATION | DATA |
|---|---|
| 1 | 10 |
| 2 | 20 |
| 3 | 30 |
| 4 | 40 |
| 5 | 0 |
| 6 | 0 |
| 7 | 40 |
| 8 | 50 |
| 9 | 5 |

DOUBLE BUFFER: locations 5–7

FIG. 5c

| MEMORY LOCATION | DATA |
|---|---|
| 1 | 10 |
| 2 | 20 |
| 3 | 30 |
| 4 | 40 |
| 5 | 0 |
| 6 | 0 |
| 7 | 40 |
| 8 | 50 |
| 9 | 4 |

DOUBLE BUFFER: locations 4–6

|   MEMORY LOCATION | DATA |
|---|---|
| 1 | 10 |
| 2 | 20 |
| 3 | 30 |
| 4 | 40 |
| 5 | 0 |
| 6 | 0 |
| 7 | 0 |
| 8 | 50 |
| 9 | 5 |

DOUBLE BUFFER: locations 5–7

FIG. 6a

|   MEMORY LOCATION | DATA |
|---|---|
| 1 | 10 |
| 2 | 20 |
| 3 | 30 |
| 4 | 40 |
| 5 | 50 |
| 6 | 0 |
| 7 | 0 |
| 8 | 50 |
| 9 | 5 |

DOUBLE BUFFER: locations 5–7

FIG. 6b

|   MEMORY LOCATION | DATA |
|---|---|
| 1 | 10 |
| 2 | 20 |
| 3 | 30 |
| 4 | 40 |
| 5 | 50 |
| 6 | 0 |
| 7 | 0 |
| 8 | 50 |
| 9 | 6 |

DOUBLE BUFFER: locations 6–8

FIG. 6c

METHOD OF REDUCING WEAROUT IN A NON-VOLATILE MEMORY WITH DOUBLE BUFFER

BACKGROUND OF THE INVENTION

This invention relates generally to a method of changing data in a non-volatile memory and, more particularly, to a method of preventing the corruption of data in a non-volatile memory if the power fails during a non-volatile memory write operation.

The present invention will be discussed in terms of a pay-per-view (PPV) cable television system, although its scope is not limited thereto. The most desirable type of PPV is impulse pay-per-view (PPV), which allows a subscriber to order a program at the last minute.

Early PPV systems worked with one way addressable set-top terminals (STT). A subscriber who wished to order a PPV event did so by calling an operator and orally placing his order. The operator entered the order into a computer, which then transmitted authorization to the subscriber's set-top terminal.

This system suffers from the requirement of using the telephone and a human operator. This increases the cost of handling PPV requests, and effectively eliminates IPPV as a viable service since only a limited number of people are able to call in during the last minutes before a program begins. Therefore, the majority of people desiring to view a program must order it long before it begins.

Another system employs a two-way cable television (CATV) plant, in which the set-top terminal may be equipped for transmitting a signal back to the headend ("upstream transmission") on a suitable frequency, such as between 5 MHz and 30MHz. The terminal transmits information as to what programs are being or have been viewed to a computer at the headend. This system suffers from the fact that no protocols have been developed which operate efficiently in an environment of an exceedingly large number of set-top terminals who "speak" very little, but who must be serviced quickly when they do speak. Further, two-way CATV plants have proved difficult to maintain with adequate integrity to permit reliable return transmission, and the cost of the plant is excessive compared to the revenues to be gained from IPPV. Memory is repeatedly used in such systems to store data prior to transmission and memory wear out can easily occur.

Another system uses credits downloaded to the terminal, and then makes deductions against the credits when a program is viewed. At the end of the month, certain alpha-numeric characters are displayed, indicating programs viewed. The subscriber writes these characters on a card which is mailed to the CATV operator. This system suffers from excessive delay in reporting programs watched, a limited number of programs which can be viewed (due to the limited number of characters a subscriber can be expected to write down), and the possibility of unrecoverable errors in transcription.

Another type of system records billing information related to the purchase of IPPV events in non-volatile memory contained within the terminal and subsequently transmits the stored billing information to the headend over the telephone network. In such a system, however, it is possible that billing information being written to the non-volatile memory (NVM) may be corrupted if a power failure occurs while the data is being written. This can result in inaccurate billing and loss of revenue to the cable operator.

SUMMARY OF THE INVENTION

Accordingly, it is an object of the present invention to provide a method of preventing the corruption of data being written to a non-volatile memory if a power failure occurs during the data write.

It is another object of the present invention to provide a method of distributing the wearout of a non-volatile memory as evenly as possible.

In accordance with the present invention, data is written to a non-volatile memory having a plurality of memory locations by first writing sufficient information to a double buffer comprising at least two memory locations to reconstruct the data writing operation. Next, a flag is set indicating that the information in the double buffer is accurate. The write operation is then performed followed by the clearing of the flag. Finally, the double buffer is dynamically moved throughout the plurality of memory locations in the non-volatile memory.

BRIEF DESCRIPTION OF THE DRAWINGS

A more complete appreciation of the invention and many of the attendant advantages thereof will be readily obtained as the invention becomes better understood by reference to the following detailed description when considered in connection with the accompanying drawings, wherein.

DETAILED DESCRIPTION OF THE PREFERRED EMBODIMENT

The present invention will be explained with regard to a cable television system, particularly a cable television system with impulse pay-per-view capability. It should be understood that the invention should not be read as limited to this application, but should be broadly read to encompass any system in which a non-volatile memory is repeatedly written to.

Figure 1:
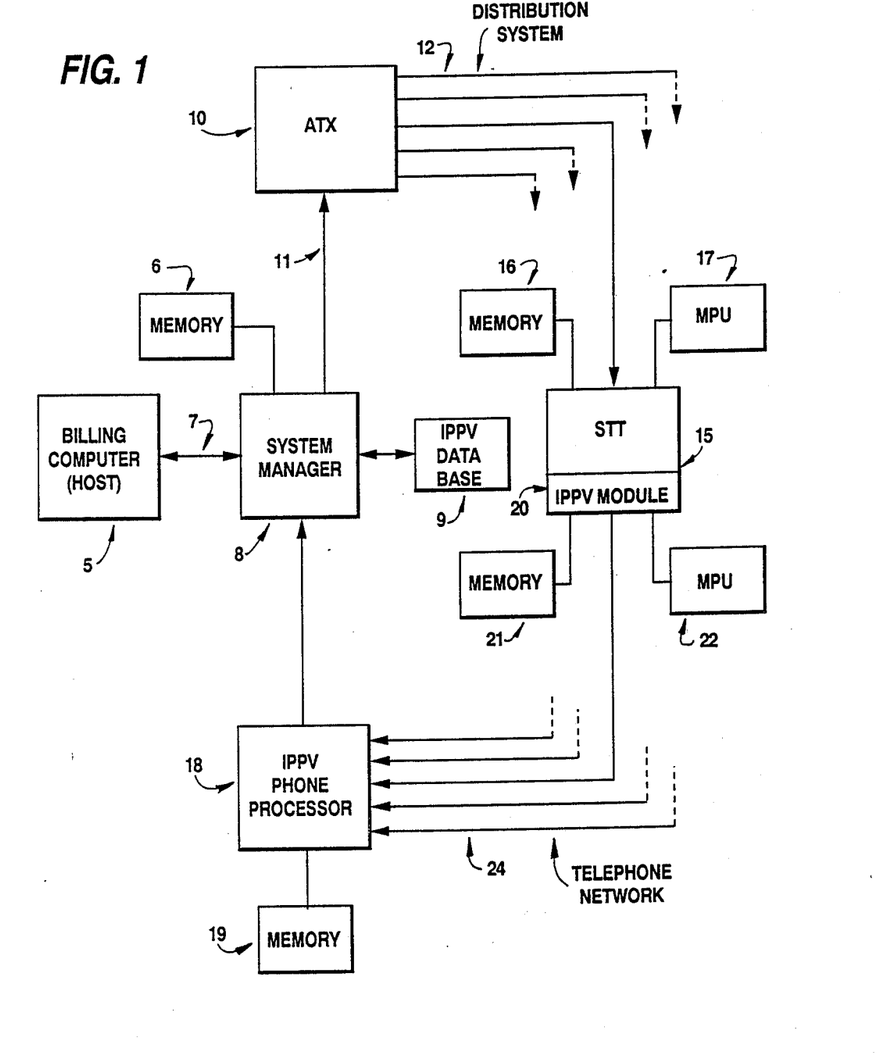
FIG. 1 is a block diagram depicting the overall configuration of an impulse pay-per-view system.

A typical impulse pay-per-view system is shown in FIG. 1. The system includes a billing computer or host 5 which comprises an essential part of a cable system having impulse pay-per-view capability. Billing computer 5 maintains records for each cable subscriber. These records may contain information such as the subscriber's name, address and telephone number, the type of equipment the subscriber has in his possession, and which pay services the subscriber is authorized to view. Typically, the cable operator owns the billing computer, leases the equipment from a vendor who specializes in this type of equipment, or shares computer time on a machine owned by one of these billing vendors.

Billing computer 5 is interfaced to a system manager 8. System manager 8 controls the cable system. Typically located at or near the billing computer 5, system manager 8 maintains a list of all the addressable set-top terminals in the cable system as well as those services which each terminal is authorized to receive. System manager 8 also defines and maintains the parameters selected by the cable operator for each system. These parameters may include the frequencies associated with each channel in the system, which channels are being scrambled, the security features of the system, and the system time. Additionally, system manager 8 is responsible for the authorization and deauthorization of pay-per-view events in the system.

A computer of system manager 8 will have a disk and controller dedicated to the storage of IPPV information. A memory resident program of system manager 8 will read the IPPV transactions, uploaded from the IPPV modules in the system. Each IPPV transaction will be stored in data base 9 until it is retrieved by billing computer 5. An operator of the system manager will have the ability to access the IPPV data base 9 and display the event identifiers (IDs) of the events that have been purchased by a converter. The data returned to the billing computer will be grouped by the identification of a particular set-top terminal or converter, that is, all event IDs associated with a particular converter serial number will be returned together. The system manager may also maintain viewing statistics based on the data returned from the converters. Finally, the system manager may prompt the converters to transmit billing information related to IPPV purchases over telephone network 24 by downloading a transaction to ATX 10.

The addressable transmitter (ATX) 10 is a device used to receive commands generated by system manager 8 and transmit them on a dedicated data channel in the cable system in format recognizable by the addressable set-top terminals. Typically, one ATX is located at each cable headend. ATX 10 will receive IPPV transactions from system manager 8 and format the appropriate commands for transmission to the IPPV equipped converters. In the alternative, an addressable in-band signalling controller (not shown) may be used to accomplish transactions related to a particular subscriber.

Each subscriber in the addressable cable system is provided with a set-top terminal (STT) 15 by the cable operator as schematically indicated in FIG. 1. STT 15 allows the subscriber to tune and descramble the services that he has requested from the cable system operator. Each STT 15 contains a unique identifier, or address, for example, a manufacturer's serial number, which allows the cable operator to send commands via ATX 10 to an individual STT. These commands are called "addressable" commands. The STT's are also capable of receiving "global" commands heard by all the STT's in a cable system. Those subscribers who are authorized to purchase impulse pay-per-view events are issued set-top terminals which have been equipped with an IPPV module 20. Module 20 allows the subscriber to authorize his STT to receive a pay-per-view event, store the data associated with the purchase of the event in memory 21, and transmit that stored data to the cable operator via the telephone network 24. The subscriber is then billed for the events that he has purchased. IPPV module 20 receives the IPPV transactions from ATX 10 via distribution system 12 and stores the IPPV parameters in non-volatile memory (NVM 21). The IPPV module also functions to authorize IPPV events and record IPPV activity in the NVM 21. Module 20 transfers IPPV data to the system manager 8 via phone processor 18 when a callback command is received. Upon successful transmission, the IPPV module will clear the events watched table maintained in NVM 21.

The present invention concerns a method of preventing a power failure during a non-volatile memory (NVM) write from corrupting the data in the NVM. The invention is also concerned with distributing wear-out as evenly as possible throughout the NVM.

Non-volatile memory is used in a set-top terminal (STT) in an impulse pay-per-view system for a variety of reasons, for example, to maintain the channels a subscriber is allowed to watch and to maintain the events a subscriber has purchased. However, if the power fails while data is being written to an arbitrary memory location, the data being written may become corrupted. Prior art set-top terminals have attempted to overcome this problem by providing a double buffer. Essentially, this mechanism ensures that before data is written anywhere else in the NVM, a double buffer location is loaded with both the data to be written and the memory location where the data will be written. Once this information has been written to the double buffer, the data is written to the desired memory location. Thus, if power fails while writing to the desired memory location, the information is preserved in the double buffer so that the write can be reconstructed when power is restored.

However, the life of a given memory location in a non-volatile memory is limited. Thus, if information is continually written to the double buffer location, the double buffer will wear out relatively quickly. Generally, however, data in the set-top is not changed very frequently. Channel authorizations, for example, do not change very often. However, in impulse pay-per-view systems, for example, subscribers are continually purchasing events which require the storage of billing information. Thus, in such systems, the memory location associated with the double buffer will wear out. This wearing out of the double buffer memory will occur much sooner than the useful lifetime of a set-top terminal. The dynamic double buffer is designed to overcome this problem. The invention essentially consists of moving the double buffer.

There are two problems which can occur if the power fails during an NVM write operation. First, "garbage" or incorrect data may be written to the memory location which was being erased or written. Second, if the operation requires several write steps, only some of the steps may have taken place when a power failure occurs. The solution, as noted, is the use of a double buffer. The double buffer is simply an area of memory which the software can use to reconstruct a write operation which was interrupted by a power failure.

The process may be summarized as follows with reference to Table 1 below. Before any write operation is performed, enough information is written to the double buffer to reconstruct such steps that will be performed during that write operation. A flag is set indicating that the information in the double buffer is accurate. The write operation is then performed. Finally, the flag is cleared. As indicated below, the four steps may be taken to define nine times during which power failure may occur.

Thus, whenever data is written to the NVM, nine times of interest as outlined in Table 1 below may be delineated.

TABLE 1

| | | |
|---|---|---|
| TIME #1 | | |
| TIME #2 | (A) | Write the data to the double buffer |
| TIME #3 | | |
| TIME #4 | (B) | Set flag indicating the double buffer is valid |
| TIME #5 | | |
| TIME #6 | (C) | Write the data to the appropriate NVM locations |
| TIME #7 | | |
| TIME #8 | (D) | Clear the flag |
| TIME #9 | | |

If the power fails at time #1, the integrity of the NVM is maintained since no operation has been performed. At time #2, since the flag indicating that the double buffer is valid has not been set, the information in the double buffer is ignored and the net effect is the same result as at time #1. At time #3, the flag has still not been set and the results are the same as at time #2. If the power fails at time #4 and the flag has been set, the information in the double buffer is valid and the entire operation will be reconstructed and performed when power is restored. If the flag has not yet been set, no operations will be performed and the integrity of the NVM will be maintained. If the power fails at time #5, the flag has already been set and the entire operation will be reconstructed and performed when power is restored. At time #6, even if a memory location has been garbled by a power failure, it will be rewritten when power is restored and the integrity of the memory will be maintained. If a power failure occurs at time #7, the entire operation will be performed when power is restored to ensure the accuracy of the NVM data, although it is most likely unnecessary. If the flag is still set when a power failure occurs at time #8, all write operations will be reperformed, although this is not necessary. At time #9, the entire operation has been completed.

The following method may be used to determine whether the double buffer is valid and to set the flag. The method is based in part on the manner in which data is written to the NVM. The manner of writing to the NVM includes first writing all 1's to the memory location followed by writing the necessary 0's to produce the desired data. During the first operation, 0's are being changed to 1's, but 1's are never being changed to 0's. During the second operation, 1's are being changed to 0's, but not vice versa. At any given time, all the changes are occurring in one direction, either low-level to high-level or high-level to low-level. Thus, the chance of the data being corrupted in such a way that something turns out to be the complement of something else is remote.

Figure 2:
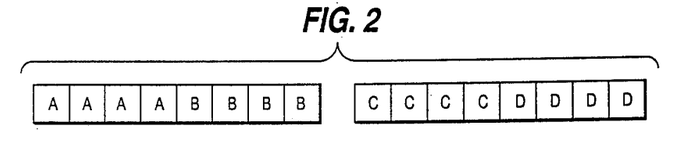
FIG. 2 illustrates the format of a flag used to indicate a valid double buffer in an embodiment of the present invention.

An index in the double buffer is used to indicate the memory location to which data is being written in the NVM. The index and the complement of the index is stored. The NVM location which stores the index also contains the flag. The format is shown in FIG. 2. The bytes 10 and 20 are indicated. The last four bits of byte 10 are compared with the last four bits of byte 20. If bbbb is the one's complement of dddd, the double buffer is presumed valid. If bbbb is not the one's complement of dddd, the double buffer is presumed invalid and the information contained therein is ignored. It is possible that if power fails while this location is being written, the incorrect data generated may match this pattern. If this were to happen, then on power up, the software would write the correct data to the wrong locations in NVM. This situation is believed to be rare since at least four bits must be garbled, and a 0 must occur for every 1. Such an occurrence has not been observed during testing of the present invention.

Since a write anywhere in the non-volatile memory is funneled through the double buffer, the double buffer would normally wear out before the other NVM locations. This would shorten the life of an NVM to an unacceptable time period. Where the NVM is incorporated in a device with a relatively long useful life, it would be advantageous to prolong the utility of the NVM to match the longer life of the device, while maintaining the advantages of the double buffer. To accomplish this, the double buffer is dynamically moved as described below with reference to Tables 2 and 3. Hexadecimal notation is used to denote the addresses.

TABLE 2

| PHYSICAL ADDRESS | LOGICAL ADDRESS | |
|---|---|---|
| 00 | 00 | |
| 01 | 01 | |
| 02 | 02 | |
| 03 | 03 | |
| 37 | 37 | |
| 38 | 38 | |
| 39 | DATA0 | Double Buffer |
| 3A | Index | |
| 3B | DATA 1 | |
| 3C | DATA 2 | |
| 3D | START1 | |
| 3E | START2 | |
| 3F | START3 | |

TABLE 3

| PHYSICAL ADDRESS | LOGICAL ADDRESS | |
|---|---|---|
| 00 | 00 | |
| 01 | 01 | |
| 02 | 02 | |
| 03 | 03 | |
| 37 | 37 | |
| 38 | DATA0 | Double Buffer |
| 39 | INDEX | |
| 3A | DATA1 | |
| 3B | DATA2 | |
| 3C | 38 | |
| 3D | START1 | |
| 3E | START2 | |
| 3F | START3 | |

The physical address refers to where data is actually located in the NVM while logical address refers to how a program sees the data as being stored. Suppose a program is accessing the memory. It is not "aware" of double buffers. The program may specify that it needs the logical address 38. Another piece of software converts the logical address to the physical address. In this case, the software would go to physical address 38, get the data, and pass it back to the program that requested it.

NVM contains address 00 to 3F. Tasks access a logical addresses space of 00 to 38. The double buffer is four words long, and with reference to Table 2, resides at locations 39 to 3C. Index contains both the address to write and a flag to indicate a valid double buffer, as described above. DATA0, DATA1, and DATA2 contain the data to write to NVM. With only one exception, all operations, in the preferred embodiment for use in an IPPV system require at most three NVM writes. If some operations were to require more than three writes, a larger double buffer including DATA3, DATA4, etc. would be required. In the present embodiment, the only operation requiring more than three writes is the initialize NVM operation. On power up, the module can detect that an initialization was in progress (from INDEX), and can perform the initialization again. Locations 3D, 3E, and 3F (START1, START2, and START3) contain the physical address of the double buffer, which in this case is physical address 39. These locations are fixed locations so that on "power up", the software can locate the double buffer. In general at least one location in the NVM must be fixed to locate the double buffer. Since the double buffer is moved only periodically, once every two weeks for example, that data in the fixed location(s) will not change often enough to cause a wearout problem.

Table 3 shows the NVM after the double buffer has been moved.

In the Table 3, the double buffer resides at locations 38 to 3B. When a task requests NVM location 38, the software maps the request to location 3C. Approximately every two weeks, the double buffer is shifted one position. When it reaches the beginning (or end), it is shifted in the other direction. This evenly distributes NVM writing throughout NVM. The time period between shifts of the double buffer is dependent on a variety of factors, and the choice of a two week time period is merely illustrative of the value presently used for an NVM in an impulse pay-per-view environment. Factors such as the amount of data writing and the amount of available memory space may be used to determine an effective time period in a particular system.

A comparison of Table 2 with Table 3 shows that the double buffer has been moved up and logical address 38 has been moved to physical address 3C. Thus, the information in physical address 38 must be moved to physical address 3C, and then the double buffer must be moved up. To move the double buffer up again, the information at physical address 37 would have to move to physical address 3B. This process will be explained with reference to the simplified memory shown in FIG. 3.

The memory of FIG. 3 has nine memory locations. Memory location 9 contains the pointer to the double buffer. In the preferred embodiment, three copies of this pointer are maintained in memory locations START1, START2 and START3 as shown in Tables 2 and 3. Memory locations 1-5 contain real data 10-50 respectively. Memory locations 6-8 contain the double buffer. Memory location 9 contains the number 6 to indicate where the double buffer is.

Figure 3A:
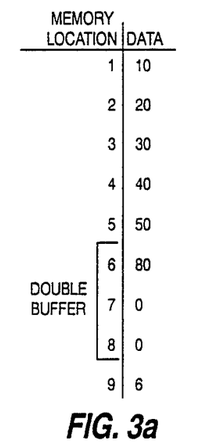
FIGS. 3a, 3b, 3c, and 3d illustrate the use of the dynamic double buffer according to the present invention.
Figure 3B:
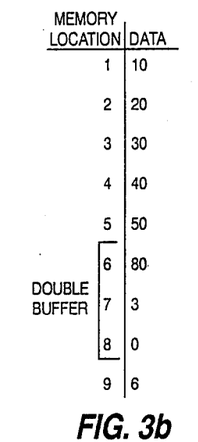

A write operation utilizing the double buffer concept will now be illustrated. Suppose the information in memory location 3 is to be changed from 30 to 80. To effect this change, the data "80" is first written to memory location 6 in the double buffer as shown in FIG. 3a. Memory location 7 contains a 0, which in this example indicates an invalid double buffer. Thus, if power were to fail at this point and subsequently be restored, the software will determine that the double buffer is not valid and will ignore any data in the double buffer. An index indicating where the information contained in the double buffer is to be written is then written to memory location 7. In this example, memory location 7 indicates that the data contained in the double buffer is to be written to memory location 3 as shown in FIG. 3b. If the power fails after the flag has been set, when power is restored, the software will determine that the data "80" is to be written to memory location 3 and will perform the operation. If the power fails while the "80" is being written, resulting in incorrect data in memory location 3, the NVM integrity is still maintained because when power is restored, the software will again determine that the data "80" is to be written to memory location 3 and will reperform the operation.

Figure 3C:
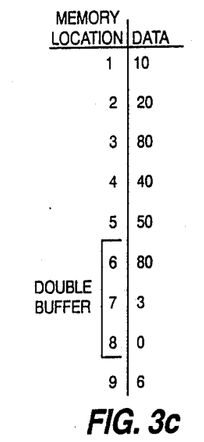
Figure 3D:
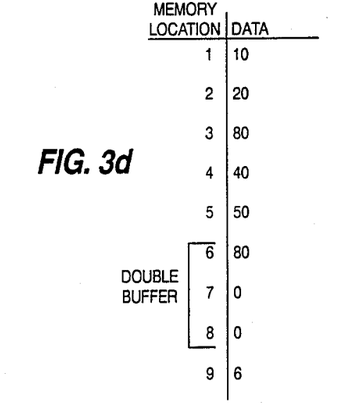

The new data "80" is then written to memory location 3 as shown in FIG. 3c. Finally, the flag in memory location 7 is cleared as shown in FIG. 3d. It is not critical that the data "80" in memory location 6 be cleared since the flag will indicate an invalid double buffer and the software will ignore any data in the double buffer.

Figure 4A:
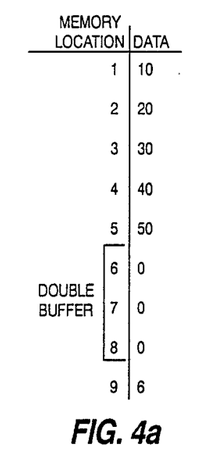
FIGS. 4a, 4b, and 4c illustrate the movement of the dynamic double buffer according to the present invention.
Figure 4B:
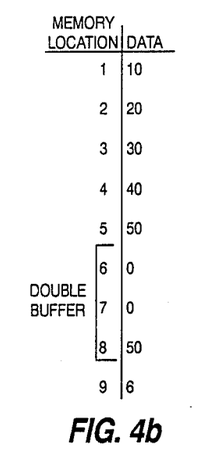
Figure 4C:
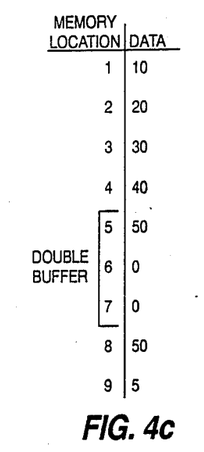
Figure 5A:
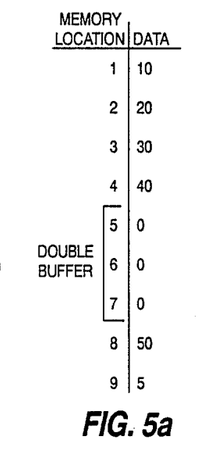
FIGS. 5a, 5b and 5c further illustrate the movement of the dynamic double buffer according to the present invention.
Figure 5B:
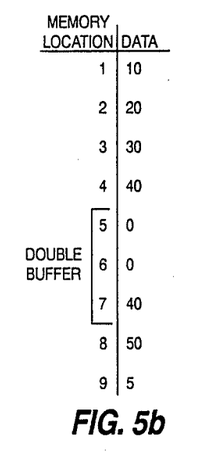
Figure 5C:
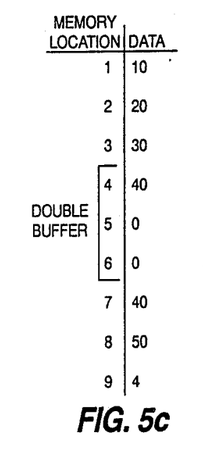

The dynamic movement of the double buffer will be explained with reference to FIG. 4. To move the double buffer, the first step is to clear the double buffer, i.e. make sure everything in the double buffer is 0 as shown in FIG. 4a. Next, the data "50" contained in memory location 5 is copied to memory location 8 as shown in FIG. 4b. At this point, if the software were routed to memory location 6 as containing the double buffer, the data is consistent since memory location 7 would be treated as the INDEX and would indicate an invalid double buffer, resulting in no operations being performed when power was restored after a power failure. If the software were routed to memory location 5 as containing the double buffer, the data is also consistent since memory location 6 would be treated as containing the index and would also indicate an invalid double buffer, again resulting in no operations being performed when power was restored after a power failure. Finally, the pointer in memory location 9 is changed to a 5 as shown in FIG. 4c and the process of moving the double buffer is complete. The double buffer may again be moved as shown in FIG. 5. Again, the first step is to clear the double buffer by writing 0's to each double buffer memory location as shown in FIG. 5a. Next, the data "40" contained in memory location 4 is copied to memory location 7 as in FIG. 5b. The pointer in memory location 9 is then changed to 4 as in FIG. 5c and the process is complete.

Figure 6A:
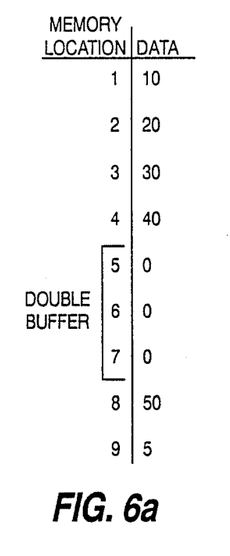
FIGS. 6a, 6b, and 6c still further illustrate the movement of the dynamic double buffer according to the present invention.
Figure 6B:
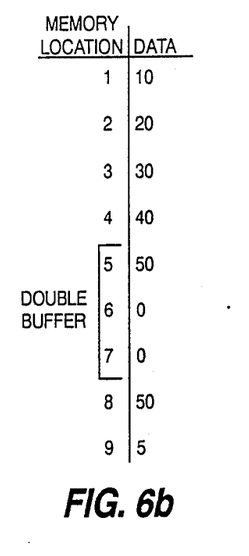
Figure 6C:
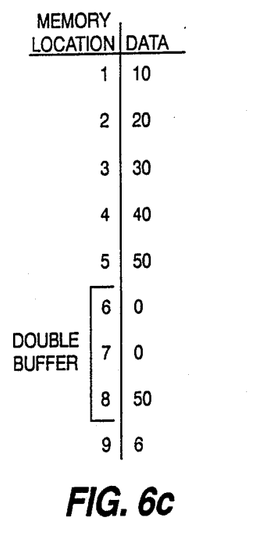

This movement of the double buffer is performed after a predetermined time period. In a preferred embodiment for an impulse pay-per-view system which implements the dynamic double buffer, the double buffer is moved approximately every two weeks. When the double buffer has moved to the top of the memory, it is moved back down. When it reaches the bottom of the memory, it is moved back up. The double buffer is moved down in a manner similar to that described above and detailed with respect to FIG. 6. To move the double buffer down, the data "50" in memory location 8 is copied in memory location 5 after the double buffer has been cleared. The pointer in memory location 9 is then changed to 6 and the process is complete. With reference to Table 4, the process generally applied to the preferred embodiment may be outlined as follows.

TABLE 4

TIME #1
TIME #2  (A)  Copy data into DATA2/DATA0 (according

TABLE 4-continued

| | | to direction) |
|---|---|---|
| TIME #3 | | |
| TIME #4 | (B) | Clear DATA0/DATA1 |
| TIME #5 | | |
| TIME #6 | (C) | Update START1 |
| TIME #7 | | |
| TIME #8 | (D) | Update START2 |
| TIME #9 | | |
| TIME #10 | (E) | Update START3 |
| TIME #11 | | |

The eleven places where power can fail will now be described. If the power fails at time #1, no operations have been performed, so the integrity of the non-volatile memory has been maintained. If the power fails at time #2, since the index is 0 at the beginning of the operation, no operations are performed on power-up and any values in DATA0 or DATA2 are thus ignored. A power failure at times #3, 4, or 5 will produce the same result as a power failure at time #2 since the index is still 0. When power is restored after a power failure at time #6 or time #7, the software examines START1, START2 and START3. If START2 and START3 are the same, then START1 is ignored and overwritten with START2. Otherwise, START1 is assumed to be correct. For this case, START2 and START3 will be equal, so START1 will be overwritten and the net effect is the same as if the power had failed at time #1. On power-up after a power failure at time #8, the software examines START1, START2, and START3. If START2 and START3 are the same, then START1 is ignored and overwritten with START2. Otherwise, START1 is assumed to be correct. If START2 happens to be the same as START3, then this is the same result as at time #6. If not, START1 is copied into START2 and START3. This effectively shifts the double buffer. Index is now where DATA0 or DATA1 was before the shift. That location had been cleared before the shifting started. Since 0 does not meet the requirement for a valid index, the double buffer is ignored. A power failure at time #9 produces the same results as one at time #8, except START2 will always be different from START3. At time #10, if START3 matches START2, the buffer has been shifted. If not, START1 is used to fix START3, and the operation is complete at time #11, the double buffer shift has been completed.

To move the double buffer, only one memory location must be moved. In the situations to which the present invention has thus been applied, no more than three memory locations must be written at once. Further these three memory locations are always consecutive. Therefore, only one index is needed to indicate where the data must go.

We claim:

1. A method of writing data to a non-volatile memory including memory locations $A_1 \ldots A_n$, the method comprising the steps of:
   (a) storing information in a double buffer comprising at least two memory locations $A_a$, $A_b$ of the memory locations $A_1 \ldots A_n$, the stored information at least including (1) the data to be written to said non-volatile memory and (2) at least one memory location $A_i$ of the memory locations $A_1 \ldots A_n$ into which the data is to be written;
   (b) writing the data to the at least one memory location $A_i$; and
   (c) moving the double buffer from memory locations $A_a$, $A_b$ to at least two memory locations $A_c$, $A_d$ of the memory locations $A_1 \ldots A_n$ at a predetermined time.

2. The method according to claim 1 further comprising the step of:
   (d) storing information in at least one fixed memory location $A_{fix}$ of the memory locations $A_1 \ldots A_n$ to locate the at least two double buffer memory locations.

3. The method according to claim 1 wherein the double buffer memory locations comprise adjacent memory locations.

4. The method according to claim 1 further comprising the step of:
   (d) writing the data to memory location $A_i$ in accordance with the information stored in the double buffer if power fails during the writing of the data in step (b).

5. The method according to claim 1 further comprising the step of:
   (d) determining whether the information stored in the double buffer is valid prior to writing the data in step (b).

6. The method according to claim 5 wherein the validity of the information stored in the double buffer is determined by comparing an index comprising at least two bits for indicating the memory location into which the data is to be written with the complement of the index.

7. The method according to claim 5 further comprising the step of:
   (e) writing the data to memory location $A_i$ in accordance with the information stored in the double buffer if the power fails during the writing of the data in step (b) and if the information stored in the double buffer is determined to be valid.

8. The method according to claim 1 wherein step (c) is repeated at a plurality of predetermined times so as to move the double buffer throughout the memory locations $A_1 \ldots A_n$ in a predetermined manner.

9. A method of moving a double buffer from memory locations $A_a$, $A_b$ of a non-volatile memory including memory locations $A_1 \ldots A_n$ to memory locations $A_b$, $A_c$ of memory locations $A_1 \ldots A_n$, the double buffer storing information at least including (1) data to be written to a memory location of said non-volatile memory and (2) a memory location $A_i$ of the memory locations $A_1 \ldots A_n$ into which the data is to be written, the data being written to memory location $A_i$ in accordance with the information stored in the double buffer if power fails during the writing of the data to said non-volatile memory and if the information stored in the double buffer is determined to be valid, the method comprising the steps of:
   clearing the information contained in memory locations $A_a$ and $A_b$ such that the information is invalid; and
   writing data contained in memory location $A_c$ to memory location $A_a$.

10. The method according to claim 9 further comprising the step of:
    storing information in at least one fixed memory location $A_{fix}$ of the memory locations $A_1 \ldots A_n$ to locate the double buffer memory locations.

11. The method according to claim 9 wherein memory locations $A_a$, $A_b$, and $A_c$ comprise adjacent memory locations.

12. The method according to claim 9 wherein the double buffer is moved at a predetermined time.

13. The method according to claim 12 wherein the double buffer is moved at a plurality of predetermined times so as to move the double buffer throughout the memory locations $A_1 \ldots A_n$ in a predetermined manner.

14. A method of writing data to a non-volatile memory in a subscriber terminal apparatus for use in an addressable pay-per-view television system, said non-volatile memory including memory locations $A_1 \ldots A_n$, the method comprising the steps of:
 (a) storing information in a double buffer comprising at least two memory locations $A_a$, $A_b$ of the memory locations $A_1 \ldots A_n$, the stored information at least including (1) the data to be written to said non-volatile memory and (2) at least one memory location $A_i$ of the memory locations $A_1 \ldots A_n$ into which the data is to be written;
 (b) writing the data to the at least one memory location $A_i$; and
 (c) moving the double buffer from memory locations $A_a$, $A_b$ to at least two memory locations $A_c$, $A_d$ of the memory locations $A_1 \ldots A_n$ at a predetermined time.

15. The method according to claim 14 wherein the data comprises billing information related to pay-per-view purchases.

16. The method according to claim 14 wherein step (c) is repeated at a plurality of predetermined times so as to move the double buffer throughout the memory locations $A_1 \ldots A_n$ in a predetermined manner.

17. An apparatus for writing data to a non-volatile memory including memory locations $A_1 \ldots A_n$, said non-volatile memory including a double buffer for storing information in at least two memory locations $A_a$, $A_b$ of the memory locations $A_1 \ldots A_n$, the information at least including (1) the data to be written to said non-volatile memory and (2) at least one memory location $A_i$ of the memory locations $A_1 \ldots A_n$ into which the data is to be written, said apparatus comprising:
 control means for moving the double buffer from memory locations $A_a$, $A_b$ to at least two memory locations $A_c$, $A_d$ of the memory locations $A_1 \ldots A_n$ at a predetermined time.

18. The apparatus according to claim 17 wherein said control means moves the double buffer at a plurality of predetermined times so as to move the double buffer throughout the memory locations $A_1 \ldots A_n$ in a predetermined manner.

19. A subscriber terminal apparatus for an addressable pay-per-view television system, said apparatus comprising:
 memory means for storing billing information related to pay-per-view purchases, said memory means including a double buffer for storing information in at least two memory locations $A_a$, $A_b$ of the memory locations $A_1 \ldots A_n$, the information at least including (1) the data to be written to said non-volatile memory and (2) at least one memory location $A_i$ of the memory locations $A_1 \ldots A_n$ into which the data is to be written; and
 control means for moving the double buffer from memory locations $A_a$, $A_b$ to at least two memory locations $A_c$, $A_d$ of the memory locations $A_1 \ldots A_n$ at a predetermined time.

20. The set-top terminal according to claim 19 wherein said control means moves the double buffer at a plurality of predetermined times so as to move the double buffer throughout the memory locations $A_1 \ldots A_n$ in a predetermined manner.

* * * * *